(12) United States Patent
Busse-Grawitz

(10) Patent No.: US 8,164,350 B2
(45) Date of Patent: Apr. 24, 2012

(54) CAPACITIVE ANGLE ENCODER AND WITHDRAWABLE FEEDER FOR CIRCUIT BOARD COMPONENT INSERTION MACHINES

(75) Inventor: Max Erick Busse-Grawitz, Alpnach Dorf OW (CH)

(73) Assignee: Maxon Motor AG, Sachseln (CH)

( * ) Notice: Subject to any disclaimer, the term of this patent is extended or adjusted under 35 U.S.C. 154(b) by 376 days.

(21) Appl. No.: 12/516,747

(22) PCT Filed: Nov. 6, 2007

(86) PCT No.: PCT/EP2007/009604
§ 371 (c)(1),
(2), (4) Date: Oct. 9, 2009

(87) PCT Pub. No.: WO2008/064760
PCT Pub. Date: Jun. 5, 2008

(65) Prior Publication Data
US 2010/0079154 A1 Apr. 1, 2010

(30) Foreign Application Priority Data
Nov. 30, 2006 (DE) .......................... 10 2006 056 609

(51) Int. Cl.
*G01R 27/26* (2006.01)
(52) U.S. Cl. ....................................... 324/658; 324/661
(58) Field of Classification Search ........................ None
See application file for complete search history.

(56) References Cited

U.S. PATENT DOCUMENTS

| | | | |
|---|---|---|---|
| 4,878,013 A * | 10/1989 | Andermo | 324/690 |
| 6,170,162 B1 | 1/2001 | Jacobsen et al. | |
| 2004/0094594 A1 | 5/2004 | Liebeke | |
| 2005/0092108 A1 | 5/2005 | Andermo | |

FOREIGN PATENT DOCUMENTS

| | | |
|---|---|---|
| DE | 10 2006 024 733 B3 | 9/2007 |
| WO | WO 00/63653 A2 | 10/2000 |
| WO | WO 02/080643 A1 | 10/2002 |

OTHER PUBLICATIONS

R.F. Wolffenbuttel et al., "An Integrable Capacitive Angular Displacement Sensor with Improved Linearity", Sensors and Actuators, Elsevier Sequoia/Printed in The Netherlands, vol. A27, No. 1-03, May 1, 1991, pp. 835-843. International Search Report (PCT/ISA/210) dated Nov. 14, 2008.
International Preliminary Report on Patentability dated Feb. 26, 2009.
Notification of Transmittal of Translation of the International Preliminary Report on Patentability (Forms PCT/IB/338 and PCT/IPEA/409) issued in International Application No. PCT/EP2007/009604 dated Sep. 11, 2009.

* cited by examiner

*Primary Examiner* — Roberto Velez
(74) *Attorney, Agent, or Firm* — Buchanan Ingersoll & Rooney PC

(57) ABSTRACT

The invention relates to a capacitive angle encoder for detecting a rotational position of a rotatable object relative to a stationary object as well as a withdrawable feeder for circuit board component insertion machines, said withdrawable feeder being equipped with an angle encoder according to the invention. The angle encoder comprises a stator that supports first and second transmitting electrodes and first and second receiving electrodes, and a rotor which supports an incremental coupling electrode and an absolute value-coupling electrode. The incremental coupling electrode is designed such that the first electrostatic field is modulated by a change in capacitance in response to a change in the rotational position of the rotor, while the absolute value-coupling electrode is designed such that the second electrostatic field is modulated by a change in capacitance in response to an absolute rotational position of the rotor. A signal processing circuit detects the first and second modulated electrostatic field and determines a measured value for the position in response to the detected field. The at least one first and second transmitting electrode and the at least one first and second receiving electrode are coplanar to one another.

17 Claims, 6 Drawing Sheets

CAPACITIVE ANGLE ENCODER AND WITHDRAWABLE FEEDER FOR CIRCUIT BOARD COMPONENT INSERTION MACHINES

The present invention relates to a capacitive angular encoder for detecting a rotational position of a rotationally movable object relative to a stationary object. Specifically, the present invention relates to a capacitive angular encoder that can be inserted in an insertable feeder for printed circuit board insertion machines. In addition, the invention relates to an insertable feeder for printed circuit board insertion machines, which is equipped with an angular encoder according to the invention.

Insertion machines are employed for positioning electronic components on a printed circuit board. The electronic components are disposed on a conveyor belt made of cardboard or plastic, and are covered by another belt. The conveyor belt is wound up to form a roll and is inserted into a feeder. The conveyor belt comprises holes on at least one side, into which a pin feed platen driven by a driving motor engages thereby moving the conveyor belt. At the same time, the cover foil is withdrawn so that the electronic components are exposed. The electronic components are positioned by the pin feed platen exactly at a transfer point, are removed by a vacuum pipette and are placed onto the printed circuit board.

As modern electronic components become increasingly smaller while their number on a printed circuit board continuously increases, modern insertion machines have to provide space for a greatest possible number of insertable feeders with conveyor belts and the electronic components. For reasons of space, the individual insertable feeders have to be as narrow as possible.

At the same time, the position of the components has to be detectable more and more exactly by means of monitoring the position of the pin feed platen and, if necessary, has to be corrected. One example for a prior insertable feeder for printed circuit board insertion machines is described in DE 10 2006 024 733.7.

In order to monitor a rotational position of a rotationally movable object relative to a stationary object capacitive angle transmitters are known, which evaluate the change in capacitance between movable electrodes disposed on a rotor and stationary electrodes disposed on a stator. A general view of known capacitive angular encoders can be inferred, for example, from the international patent publication WO 00/63653 A2. However, all of the solutions proposed in this patent document have the drawback that they do not provide for the accuracy necessary for modern insertion machines and, moreover, require an electric shielding as protection against electromagnetic interferences, which further increases the construction size in an inadmissible manner.

Particularly in connection with such miniaturized and high-precision insertable feeders there is, therefore, the need for a position sensor system which, on the one hand, allows a greatest possible positioning accuracy of the feeder and, on the other hand, has a small total height and is as robust as possible with respect to electromagnetic interferences.

This object is achieved with a capacitive angular encoder comprising the features of patent claim 1. Advantageous advancements of the present invention are defined in the dependent claims.

The present invention is based on the idea to realize a capacitive angular encoder in such a way that an incremental measurement and an absolute measurement of the position of the mobile object are performed simultaneously, and that transmitting and receiving electrodes are arranged together on one and the same stationary substrate, with conductive patterns being arranged on the rotor, so-called coupling electrodes, which are influenced by the transmitted electromagnetic field and change the field measured by the receiving electrodes by means of their motion.

Thus, the output signal of the receiving electrode is a function of the varying capacitance between the rotor and the stator. According to the invention the transmitting and receiving electrodes for the incremental transmission system and the absolute transmission system are arranged coplanar with respect to each other. Thus, all stationary electrodes can be produced in one processing step and require a minimum of space. A signal processing circuit is provided to evaluate the signals supplied by the respective receiving electrodes and to provide a measured value for the position of the moving object, e.g. of the pin feed platen of an insertable feeder. Of course, the capacitive angular encoder system according to the invention may also be used to monitor any other rotational positions requiring high accuracy and small construction sizes.

According to an advantageous embodiment the at least one transmitting electrode, which belongs to the incremental transmission system, is formed by four groups of transmitting electrodes of the same kind, which are interconnected in such a way that each group is supplied with a transmit signal which is substantially orthogonal with respect to the other groups. Such a differential excitation leads to forming a difference between the signals and is advantageous above all in fast operations because no problems with the common mode rejection ratio (CMRR) occur. Particularly a fast and sensitive angular encoder requires high frequencies. However, the common mode rejection ratio decreases by 20 dB/Dec and is, therefore, non-usable at 20 mHz. There exist, however, good balanced amplifiers also for very high frequencies. According to the invention digital drivers are used for driving the transmitting electrodes, as a particularly cost-efficient construction of the overall circuit can thus be obtained.

Moreover, if a separate evaluation of the quadrature channels is provided, specifically by providing two groups of receiving electrodes in the incremental path, an increased signal integrity can be obtained, that is, there is no more noise of the respective other channel in one of the channels.

Although the interdigital arrangement of the receiving electrodes and the transmitting electrodes comes along with increased requirements as to the patterning of the stator substrate, especially as a great number of vias and very fine patterns are required, this configuration has the significant advantage that the sensitivity can be enhanced considerably.

According to the invention the incremental coupling electrode is formed by a sinusoidal structure which is formed circumferentially on the rotor, so that a sinusoidal output signal is generated.

According to the invention separate signal processing circuits are each provided to evaluate the incremental signal and the absolute-value signal.

If a phase shift keying heterodyne architecture is used instead of the commonly employed synchronous mixing onto DC, problems with 1/f noise, 50 Hz interferences and the like are avoided. Moreover, a fully digital demodulation may be performed, which significantly reduces the interference susceptibility and the circuit complexity. Analog/digital converters are no longer required for the signal processing according to the invention.

The configuration according to the invention further allows the use of a pseudo-random-cyclic (PRC) code for the outputted absolute value. To this end, the receiving electrodes have to comprise n or two times n individual receiving electrodes each (which are also called "pickups") so as to permit the reading of a valid PRC value at all times. Furthermore, if one or more redundant pickups are provided, also an error correction PRC code may be implemented. The summation is accomplished directly on the receiving electrode, and one obtains the value for n from the following calculation rule:

n=rounding up[log 2 (number periods of the incremental track], that is, for example, n=5 at 72 quad-counts (=18 periods) or n=4 at 64 quad-counts (=16 periods).

Apart from the reduced geometrical dimensions the configuration and signal processing according to the invention above all have the advantage that the angle detection may be realized as an open system and without a closed shielding. Thus, the mounting costs may be kept low, on the one hand, and valuable construction space may be saved, on the other hand.

The angular encoder according to the invention shall be explained in more detail by means of the accompanying drawings, with corresponding components and elements being provided with like reference numbers. In the drawings.

Figure 1:
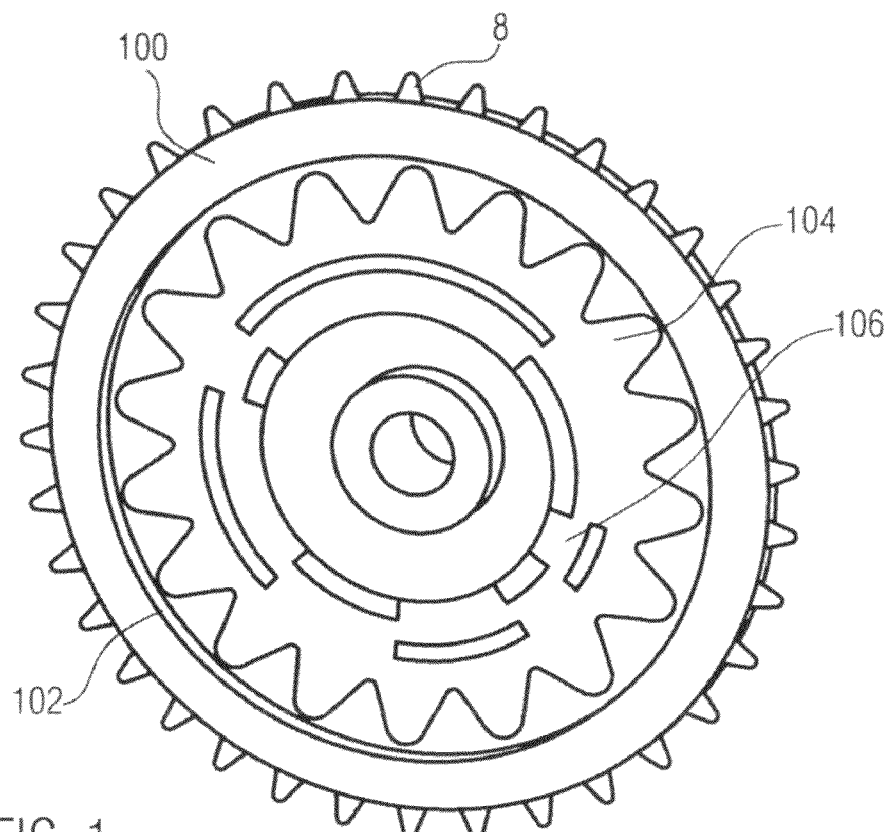
FIG. 1 shows a perspective view of a pin feed platen provided with a coupling electrode structure according to the invention.

FIG. 1 shows a perspective view of a pin feed platen 100 for positioning a conveyor belt in an insertable feeder, which is equipped with a coupling electrode according to the present invention. By means of the capacitive evaluation of the position of the coupling electrode or also code disc 102 it is possible to compensate the geometrical deviation of individual teeth of the pin feed platen 100 of an insertable feeder according to the German Patent Application DE 10 2006 024 733.7 in a calibration process. To this end, the pin feed platen 100 is measured by a high-precision reference system, and the correction values are stored in a data table.

According to the invention the encoder system not only comprises an incremental detection of the rotational position of the pin feed platen 100, but also a detection of the absolute angular position. The use of such an absolute detection allows a direct assignment to the correction table at each transfer position, so that no reference point has to be moved to and no components get lost. According to the invention the number of the available absolute positions must be at least as great as the number of the transfer positions. In the present case these are 72 positions, i.e. a transfer position is provided every five angular degrees on the pin feed platen 100. The measuring principle used for the present angular encoder is a capacitive method, with transmitting electrodes 111, 112 and receiving electrodes 110, 114 being arranged on a stator (in FIG. 2 designated with reference number 108) which are each provided in the direct proximity of each other. The electrostatic field transmitted by the transmitting electrode is modulated by coupling electrodes of the code disc 102 and specifically by their geometrical position with respect to the receiving electrodes of the stator 108, so that the information about the position of the pin feed platen 100 can be obtained by evaluating the signal on the receiving electrodes of the stator 108.

According to the invention the present angular encoder comprises both an incremental system consisting of a sinusoidal incremental track 104 on the mobile code disc 102 and an array of interdigital transmitting and receiving electrodes arranged on the periphery of the stator, and an absolute-value transmission system comprising as a coupling electrode an absolute track 106 on the code disc 102 and transmitting electrodes 111 as well as receiving electrodes 110, so-called pickups, on the stator 108.

Figure 3:
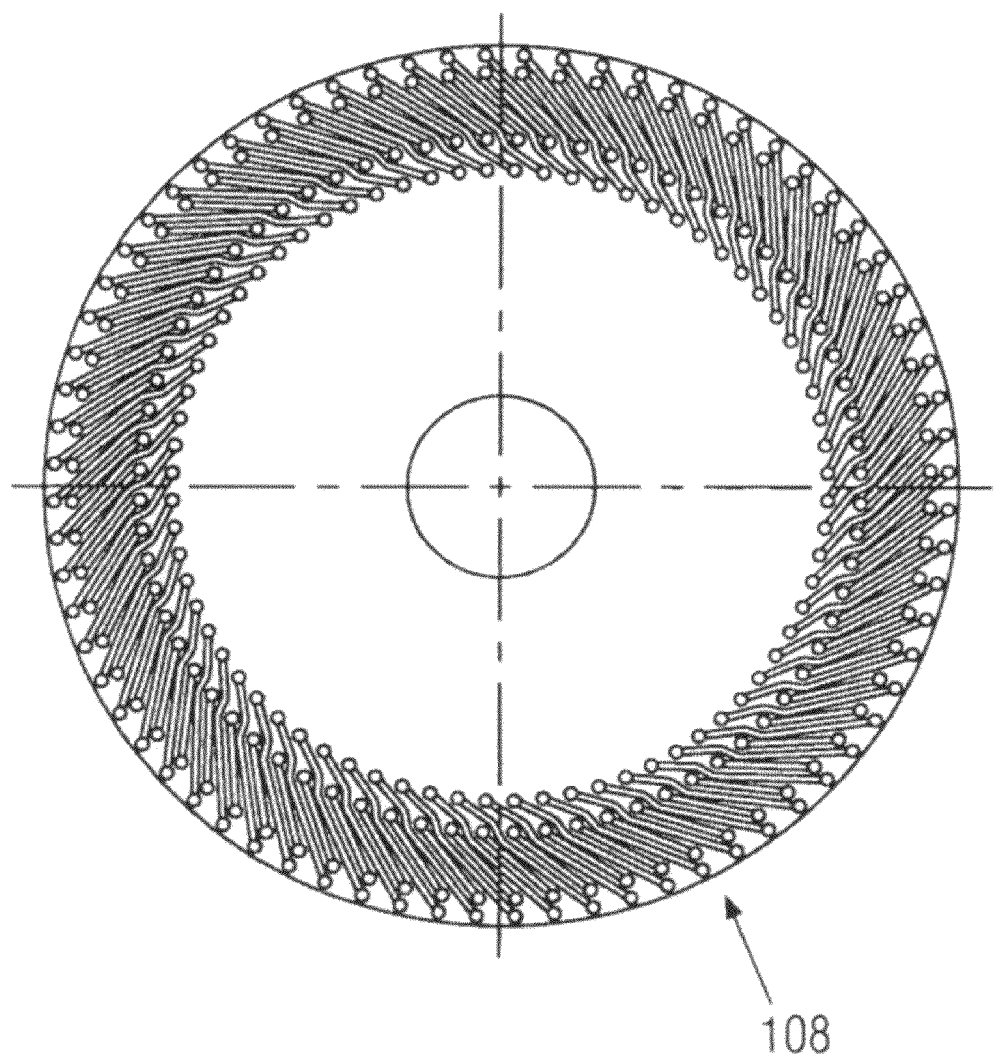
FIG. 3 shows a layout of the electrode wiring of the system of FIG. 2 on the backside.

As is shown in FIG. 3, the individual electrode structures are electrically interconnected on the backside of the stator 108 and are connected to the signal processing circuit (not illustrated in the figures).

Figure 4:
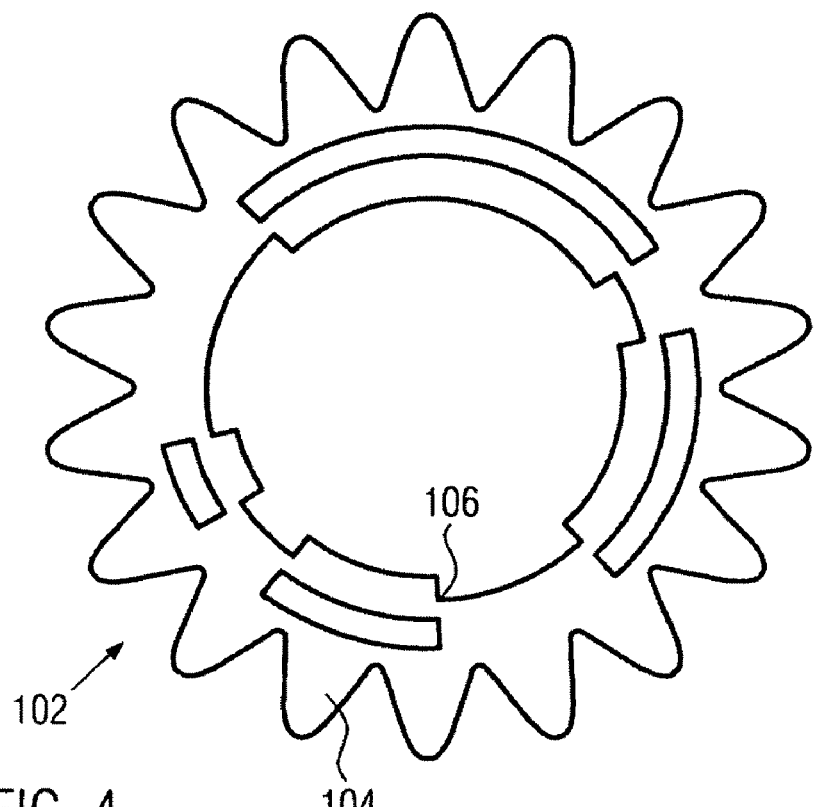
FIG. 4 shows a layout of the coupling electrode structure of FIG. 1.
Figure 5:
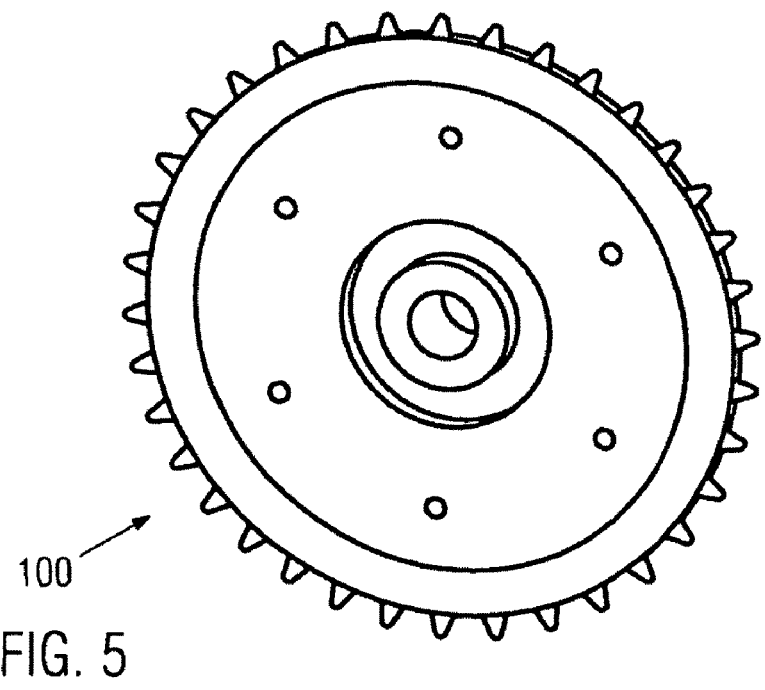
FIG. 5 shows a schematic view of a pin feed platen prior to mounting the coupling electrodes.

The code disc 102 acting as coupling electrode is occasionally also called target. FIG. 4 once more shows a direct top view of this code disc, while FIG. 5 is a perspective view of the pin feed platen 100 without the code disc.

It is generally known that an appropriately structured target generates a position-dependent capacitance on a so-called pickup, a receiving electrode assembly. Basically, however, capacitive sensors always have the disadvantage that the capacitance is not only dependent on the target variable to be measured, i.e. in the present case the angle of rotation $\phi$, but also on many other undesired variables, such as the distance to the target, the temperature and other disturbance variables.

In order to eliminate these disturbance variables it is known to carry out the measurement four times, so that one measurement is made per so-called "quad-count". One talks here about 0°, 90°, 180° and 270° in electric degrees. By such an orthogonal and differential arrangement one obtains a unique angle information, regardless of offset and scaling. In the stator layout shown in FIG. 2, 4×18 transmitting and receiving electrodes are interconnected for the incremental transmission system to result in four electrodes, which shall be referred to as A+, B+, A− and B− below, with A=A++A− and B=B++B−. A zero crossing at the A or B signal results in a quad-count.

As was already mentioned before, changes in capacitance are measured with a capacitive encoder or angular encoder, whereby it is necessary that the measurement should be insensitive to drift, leakage, temperature influences and the like. Therefore, in a manner known per se, a differential capacitance is determined according to FIG. 6. In the layout shown in FIG. 6 the ground electrode would correspond to the code disc 102 and the transmitting electrode 112 on the stator would be the counterelectrode.

Figure 6:
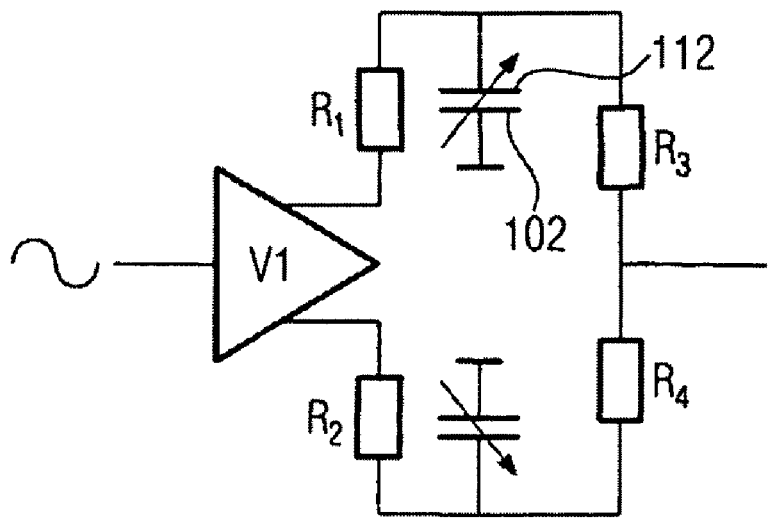
FIG. 6 shows a simplified circuit diagram of a capacitive evaluating circuit.

In the layout shown in FIG. 6 a balanced, push-pull-operated amplifier drives the capacitances to be measured via two identical output resistors R1, R2, with the voltage breaking down in dependence on the capacitances. By means of the output resistors R3, R4 a summation takes place, resulting in 0 if the capacitances are identical.

However, this architecture has a number of disadvantages: the accuracy of the measurement depends of the symmetry of the amplifier V1 as well as on the counterbalancing of the four resistors R1 to R4. The four resistors R1 to R4 attenuate, on the one hand, the measured signal and add noise to it, on the other hand. Finally, to avoid the disadvantages of the resistive circuit, the use of a pair of drive amplifiers would be possible, which would lead to a more expensive circuit, however.

Figure 2:
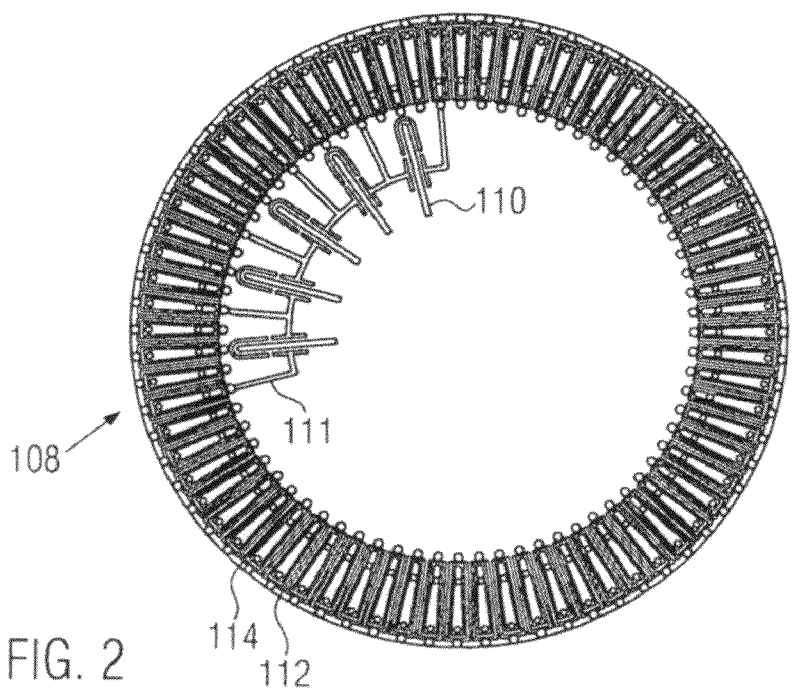
FIG. 2 shows a top view of the associated electrode structure of the stator.

Therefore, the angular encoder according to the invention employs the system already mentioned in connection with FIGS. 1 and 2, which comprises transmitting and receiving electrodes on the stator and an electrode on the rotor, which only acts as a coupling electrode. This measurement of the so-called transcapacitance makes use of the characteristic of the target 102 to also act as a shielding. That is, if two electrodes instead of one are placed on the stator, the capacitance between these electrodes can be measured as so-called transcapacitance, whereby the interrelationship between the distance of the target 102 and the measurable capacitance is reversed as in the case shown in FIG. 6: the closer the target, the smaller is the measurable transcapacitance. The capacitance of the coupling electrode 102 to ground is still existing and increases when the target approaches.

Of course, the measurement of the transcapacitance, if realized unipolar, has the same disadvantages as the measurement of the capacitance to ground according to FIG. 6. Specifically the offset/wanted signal ratio is unsatisfactory. Therefore, the measurement of the transcapacitance, too, has to be carried out differentially. A schematic circuit diagram of the inventive circuit layout is shown in FIG. 7.

Like in FIG. 6, the differential amplifier V1 drives two electrodes which are provided at 180° with respect to each other (that is, for example, A+ and A− electrodes or B+ and B− electrodes). According to the invention a receiving electrode is each located in the physically direct proximity of the two transmitting electrodes 112, which is also referred to as pickup and is interconnected to realize a sum electrode which forms the output of the circuit.

Figure 7:
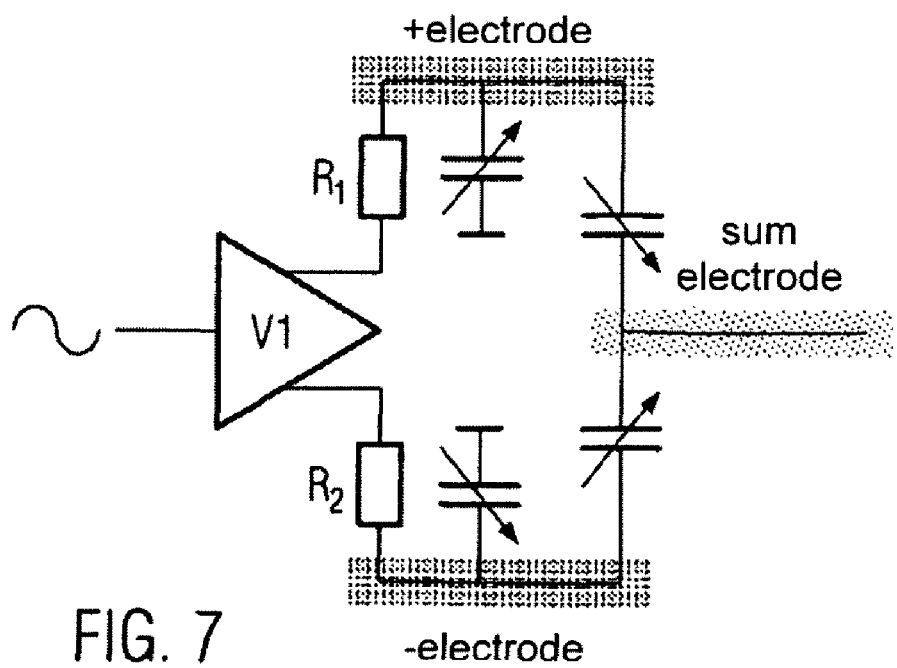
FIG. 7 shows a simplified circuit diagram of the evaluating circuit used in the system according to the invention.

As the capacitances to ground and the transcapacitances each adopt courses in opposite directions, the resistors R1 and R2 at the output of the amplifier V1 of the circuit shown in FIG. 7 are advantageous because the voltage divider action and the action of the transcapacitance supplement each other. However, as was mentioned above, the absolute amplitude of the signal is reduced. According to an advantageous embodiment the resistors R1 and R2 are therefore provided with 0Ω, i.e. are determined only by the internal resistance of the drivers.

In order to increase the sensitivity of the circuit shown in FIG. 7 a configuration with coils instead of the resistors R1 and R2 would be suitable, so that the wiring is brought in resonance with the electrode structure. However, as the aforementioned voltage divider action has a negative influence in this case, it is important to dimension the coils in such a way that the resonance frequency is slightly underneath the excitation frequency.

With a resistance value of R1=R2=0Ω and the geometrical arrangements of the electrodes shown in FIGS. 1 and 2 the following benchmark data can be expected for the values occurring: capacitance of the pickup to ground approximately 40 pF, maximum amplitude at symmetric 3 V excitation 17 mV, differential transcapacitance to be measured at $1/80°$ shift from neutral point: 1 fF.

Such low changes in capacitance can only be detected by a highly sensitive electronic system. According to the invention a signal processing circuit is provided, which is able to detect the polarity of the differential transcapacitance. The measurement is substantially accomplished in two stages:
generating a symmetric voltage for a pair of electrodes, i.e. A+ and A− or B+ and B−.

detecting the polarity of the voltage occurring at the output pickup to determine whether the voltage has the same or the opposite polarity as the input signal.

An inexpensive way to generate two signals with opposing polarities as supply voltage is the use of a digital logic, the requirements being: a good symmetry, as otherwise the duty cycle of the encoder signals will deviate from 50%; the driver resistance is small as compared to the reactance of the pickups, sufficiently high frequency to allow a good measurement of the currents to be anticipated; no interference with A and B signals, i.e. the A and B signals have to be orthogonal with respect to each other as otherwise a distance-dependent contorsion of the encoder signal occurs.

Particularly the last requirement shows that the system clock is four times higher than the signal clock, if possible. According to the invention, for example, a clock of 60 MHz can be chosen, which is then divided down to 15 MHz. The A+, B+, A− and B− signals are each shifted by 90°.

For detecting the polarity of the occurring pickup voltage a mixer is required, which is general common use for detecting the angle between two signals. In the most general sense a mixer is a non-linearity by which a sum of the two signals is processed. The non-linearity results in a product term which contains the desired information. Known mixers have three connections: RF (radio frequency) designates the signal to be analyzed. LO (local oscillator) designates the difference with which the signal is compared. The local oscillator is mostly available at a very high amplitude and drives the non-linearity, frequently a switch. In many mixers RF and LO may be interchanged without disadvantageous consequences.

IF (intermediate frequency) is the output carrying the differential frequency from RF and LO. In most cases the output carries yet other frequencies, such as sums and other product terms which have to be eliminated appropriately by means of filtering.

The non-idealities of such a mixer are, inter alia, undesired product terms, the compression of the IF signal, which is irrelevant if only a pure polarity detection is desired, the so-called LO-to-RF leakage by which an offset is generated. This leakage is above all caused by parasitic capacitances, which are hard to compensate because of their temperature dependence and non-linearity, and finally the LO-to-IF leakage, which is rather harmless, but has to be eliminated by filtering.

A mixer having a very low LO-to-RF leakage (less than, for example, 40 dB) is extremely expensive, so that therefore, according to the invention, a direct mixing onto DC is avoided because the wanted signal in the resulting output signal cannot be differentiated from the offset. Other reasons speaking against mixing onto DC are the 1/f noise and any interferences occurring in the audio-frequency range, such as 50 Hz, pulse width modulation of the motor, switched-mode power supplies and the like.

According to the invention a mixing onto an intermediate frequency IF is therefore performed, which differs sufficiently well from DC, i.e. for example a RF of 15 MHz, a LO of 14 MHz and an IF of 1 MHz and 29 MHz (the latter being filtered out). Such an architecture is called a heterodyne architecture.

Figure 8:
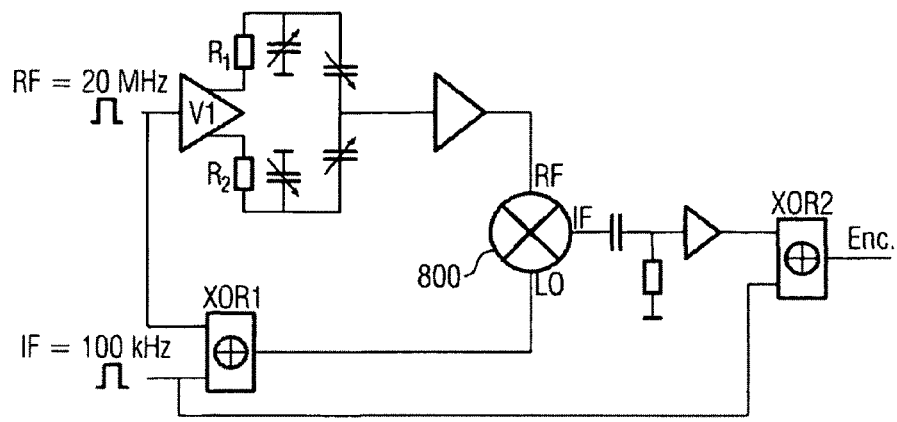
FIG. 8 shows a simplified circuit diagram of the digital phase detection according to the present invention.

According to the invention a digital variant type of a heterodyne architecture is realized, which is shown in FIG. 8. The circuit layout according to the invention is here based on the following reflections:

If the RF is analyzed by a LO of the same polarity, a voltage is generated at the output of the mixer, which can be expressed as U=f(RF)+g(LO), with the term g (LO) being so strongly dominant (due to the LO-to-RF leakage) that the wanted signal term f of RF cannot be evaluated reasonably. If the RF is analyzed by a LO with opposing polarity, the voltage U=−f(RF)+g(LO) is generated at the output of the mixer. If the two above-mentioned steps are carried out alternately an output voltage U=g(LO)+/−f(RF) is obtained. The term g(LO) is a DC offset which may be eliminated by a high-pass filter. Obtained is a term +/−f(RF), which either has the same or opposite polarity as the above-mentioned measurements. This term can be converted to a digital value by a good amplification. The evaluation is then accomplished by means of exclusive-OR (XOR) elements.

In the schematic circuit of such a capacitive encoder with a digital phase detection as shown in FIG. 8 the first exclusive-OR gate XOR1 serves to periodically switch the polarity of the RF signal. The second exclusive-OR gate XOR2 tests whether the output signal has the same or the opposite polarity as the IF. The effective encoder signal (A or B) is then available at the output.

Figure 9:
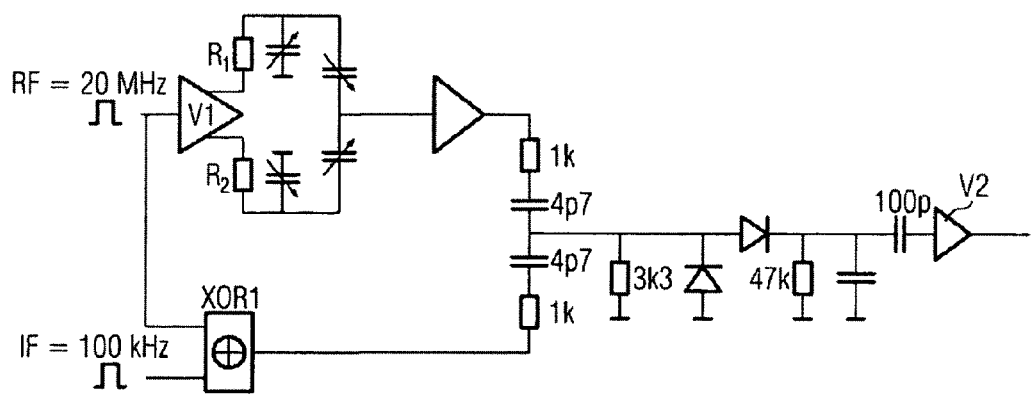
FIG. 9 shows an exemplary mixer structure according to the present invention.

The choice of the mixer 800 is, above all, dominated by cost reflections as the above-described method provides satisfactory results even if a mixer of lower quality is used. As was already mentioned before the mixer is a non-linearity, and the most inexpensive non-linearity is a diode. The only significant prerequisite is that it is fast enough. Therefore, according to the invention, the circuit layout shown in FIG. 9 is employed by using a diode 802. Here, the circuit shown in FIG. 9 substantially corresponds to the one shown in FIG. 8, with the logic gate XOR2 not being illustrated for reasons of simplicity and with the mixer 800 being replaced by a diode 802 with a suited configuration.

Another way to realize a cost-efficient mixer consists in using a high-frequency switch driven by the LO signal at the digital input. A differential voltage is generated at the output of the switch, which may be filtered and amplified.

The RF and LO inputs of the circuit of FIG. 9 are symmetrical and go to the same port, the RF-to-LO leakage is correspondingly high but, as was mentioned before, harmless. The 1 kΩ resistors serve the current limitation, the 4p7 capacitor prevents the IF terms from retroacting on the RF and optimizes the transient time of the circuit.

The 1 k resistors are high and result in a de facto current source. As is known, the current at the input and the output of a diode is equal, so that the non-linearity of the diode has no effect as far as the charge transfer is concerned if no alternative path is made available to the upcoming charge. This is the meaning of the 3k3 resistor.

Figure 10:
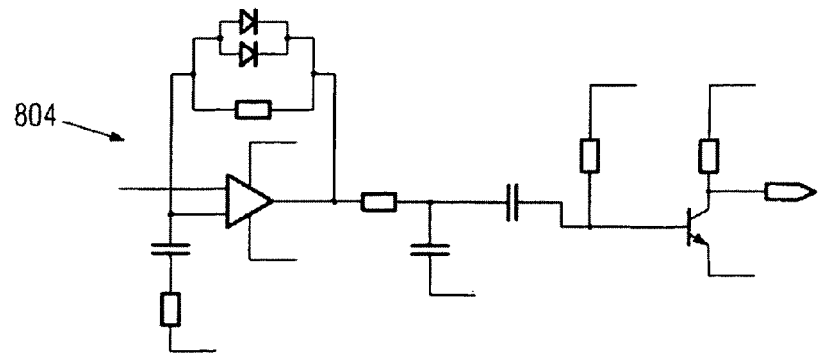
FIG. 10 shows a schematic circuit diagram of a two-stage limiting amplifier usable together with the system of FIG. 9.

The RC combination of 47k and 47p forms a low-pass filter for eliminating the LO and other high-frequency components. The 100p capacitor serves together with the succeeding amplifier as high-pass filter so as to eliminate the DC term g(LO). The succeeding amplifier V2 is a two-stage limiting amplifier, which is adopted to cope with great amplitude fluctuations fast and in a robust manner. FIG. 10 schematically shows the amplifier module 804.

By using the inventive signal processing electronics a transient time of approximately 4 μs can be observed. The RF can be, for example, 15 MHz and the LO can be RF/128=approximately 115 kHz.

According to the invention the capacitive angular encoder comprises both an incremental transmission system and an absolute transmission system. The measuring principle and the detection electronics of both systems are identical, and the difference can be seen in the configuration of the electrodes.

The absolute track of the stator shown in FIG. 2 consists of five pickups, each sensing whether a 0 or a 1 is present on the target 102 (absolute track 106 of FIG. 1). Here, the excitation is also symmetrical, and the differential transcapacitance is measured. To obtain a difference regardless of the distance, the absolute track 106 on the pin feed platen 100 is formed of a 0-track and a 1-track. The O-track is close to the axis of rotation, the 1-track is disposed slightly more outwardly.

In the embodiment shown the absolute track comprises 18 conditions. The requirement that a valid absolute value has to be outputted for each quad-count results in that the absolute track has to supply a valid value in 72 positions. Therefore, in correspondence with the required selectivity, the pickups have to be narrow. The sensitive surface per pickup is approximately 2% of the surface of the incremental pickup.

In order to avoid that the target and the carrier thereof picks up charge from the incremental track, so that the absolute track supplies a mixture of A/B and its own information, the target and its carrier has, according to the invention, to carry low-impedance ground potential.

As this is difficult to observe, above all if the frequencies are high, according to the invention the galvanic connection between the motor and the target is separated, for example, by inserting a toothed wheel made of plastic. Alternatively, the motor current may also be reduced during the zero crossing of the encoder.

According to the invention the absolute track holds an 18 bit pseudo-random-cyclic (PRC) code. Such a code permits carrying only one single absolute track instead of five thereof. The observation of five consecutive bits permits a unique determination of the position of the pin feed platen 100. The PRC code can be obtained, for example, by an optimized Brute-Force-Algorithm. The decoding is accomplished in a programmable logical control circuit (programmable logic device, PLD).

Figure 11:
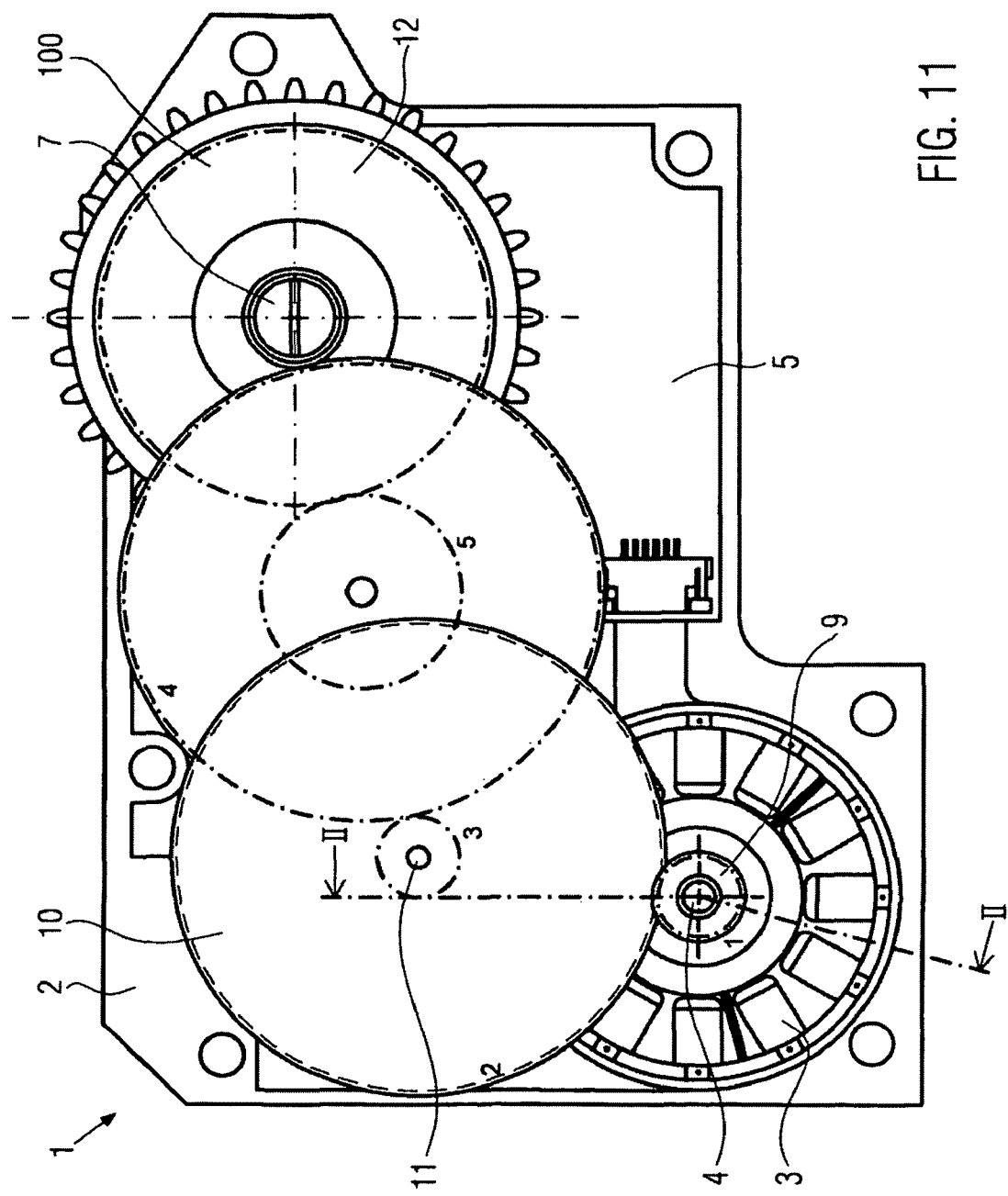
FIG. 11 shows a lateral view of an insertable feeder.

FIG. 11 shows a lateral view of an insertable feeder 1 for printed circuit board insertion machines, with the position of the pin feed platen 100 being monitored by an angular encoder according to the invention.

The insertable feeder 1 comprises a housing with a side wall 2. A flat motor 3 is fixed to the side wall 2. In order to reduce the thickness of the insertable feeder 1 the flat motor 3 is fixed to the housing of the insertable feeder 1 in such a way that the rotor axis 4 of the flat motor 3 extends perpendicularly to the housing wall 2.

The flat motor 3 may be used to drive a conveyor belt on which electronic components are arranged, which are provided by the feeder to be placed on a printed circuit board. However, the flat motor 3 may also serve to pull off a cover foil, which is disposed on the conveyor belt and protects the electronic components, from the conveyor belt to provide access to the electronic components. Also, it is possible that the flat motor 3 fulfills both functions. Below it will be described that the flat motor 3 is used as a drive for the conveyor belt.

In this case, the flat motor 3 is connected to the pin feed platen 6 by a transmission unit 5. The pin feed platen 100 is likewise mounted on an axis 7 extending perpendicularly to the side wall 2. The conveyor belt is driven by the pin feed platen 100. To this end, the pin feed platen 100 comprises teeth or pins 8, respectively, over its circumference. The conveyor belt is provided with holes on at least one edge, similar to a film for a camera. The pins 8 of the pin feed platen 100 engage into these holes of the conveyor belt and pull the conveyor belt with it.

A toothed wheel 9 is disposed on the rotor 14 of the flat motor 3. The toothed wheel 9 is in engagement with a toothed wheel 10 of the transmission unit 5. The toothed wheel 10 is mounted on a transmission axis 11 which likewise extends perpendicularly to the side wall 2. Depending on the required transmission ratio the transmission unit 5 comprises further toothed wheels mounted on transmission axes which extend perpendicularly to the side wall. On the axis 7 of the pin feed platen 6, too, a toothed wheel 12 is provided. The last stage of the transmission unit 5 is engaged with this toothed wheel 12 and transmits the force of the driving motor 3 to the pin feed platen 100.

To achieve an exact positioning of the electronic components disposed on the conveyor belt at the transfer points for the component-placement head, the code disc 102 of the inventive angular encoder is mounted directly on the pin feed platen 100. The encoder allows to compensate the geometrical deviation of individual teeth of the pin feed platen 100 in a calibrating operation. To this end, the pin feed platen 100 is measured by a high-precision reference system and the correction values are stored in a data table.

By means of one or more additional tracks the encoder system according to the invention not only provides for the incremental, but also for the absolute angular position. In this absolute encoder system the number of the available absolute positions is at least as great as the number of the transfer positions on the pin feed platen. By this, a direct assignment to the correction table at each transfer position is possible. Thus no reference point has to be moved to, so that no components get lost.

The invention claimed is:

1. Capacitive angular encoder for detecting a rotational position of a rotationally movable object relative to a stationary object, the angular encoder comprising:
   a stator which is connected to the stationary object, wherein the stator carries at least one first transmitting electrode for generating a first electrostatic field, and at least one first receiving electrode for receiving the first electrostatic field, and wherein the stator carries at least one second transmitting electrode for generating a second electrostatic field, and at least one second receiving electrode for receiving the electrostatic field;
   a rotor configured for connection to the rotationally movable object and carrying at least one incremental coupling electrode for modulating the first electrostatic field by a change in capacitance in response to a change of a rotational position of the rotor, wherein the rotor carries at least one absolute-value coupling electrode for modulating the second electrostatic field by a change in capacitance in response to an absolute rotational position of the rotor; and,
   a signal processing circuit for detecting the first and second modulated electrostatic fields, and for determining a measured value for the position of the rotationally movable object in response to the detected fields, wherein at least one of the first and second transmitting electrodes and at least one of the first and second receiving electrodes are arranged on the stator as a plurality of circumferential equidistant interdigital electrodes.

2. Angular encoder according to claim 1, wherein at least one of the first and second transmitting electrodes and at least one of the first and second receiving electrodes are arranged coplanar with respect to each other.

3. Angular encoder according to claim 1, wherein the first transmitting electrode is formed by four groups of transmitting electrodes, which are interconnected such that each group is supplied with a transmit signal which is substantially orthogonal with respect to the remaining groups.

4. Angular encoder according to claim 1, wherein the incremental coupling electrode has a sinusoidal structure which is formed circumferentially on the rotor.

5. Angular encoder according to claim 1, wherein the incremental coupling electrode has a rectangular structure which is formed circumferentially on the rotor.

6. Angular encoder according to claim 1, wherein the absolute-value coupling electrode has at least one step-shaped structure which is formed circumferentially on the rotor.

7. Angular encoder according to claim 1, wherein each of the second transmitting electrodes are formed by a plurality of electrode structures arranged asymmetrically in a portion of the rotor, and each of the second receiving electrodes are formed by electrode structures arranged interdigitally between the second transmitting electrodes.

8. Angular encoder according to claim 1, wherein the signal processing circuit comprises:
   an incremental coding unit connected to the at least one first receiving electrode and an absolute coding unit connected to the at least one second receiving electrode.

9. Angular encoder according to claim 8, wherein redundant second receiving electrodes are provided for error correction.

10. Angular encoder according to claim 1, wherein the signal processing circuit comprises:
    a phase shift keying heterodyne architecture.

11. Angular encoder according to claim 1, wherein the at least one second receiving electrode supplies an absolute value signal which is coded by a pseudo-random-cyclic code.

12. Angular encoder according to claim 1, wherein the absolute-value coupling electrode comprises:
    two absolute tracks which are complementary with respect to each other and are arranged circumferentially on the rotor.

13. Angular encoder according to claim 1, wherein the transmitting and receiving electrodes of the stator are realized as conductor tracks on a printed circuit substrate.

14. Insertable feeder for printed circuit board insertion machines, comprising, in combination:
    a housing;
    a driving motor;
    a transmission; and
    a pin feed platen engaged with a conveyor belt, wherein a rotational position of the pin feed platen for positioning the conveyor belt is detected by a capacitive angular encoder according to claim 1.

15. Insertable feeder according to claim 14, wherein a pulse number of the capacitive angular encoder is identical with a number of transfer positions of the pin feed platen.

16. Insertable feeder according to claim 14, wherein the pin feed platen is galvanically isolated from the driving motor.

17. Insertable feeder according to claim 14, comprising:
    a controller for driving the driving motor to reduce motor current during a zero crossing of the capacitive angular encoder.

* * * * *